United States Patent
Xu

(10) Patent No.: US 10,665,658 B2
(45) Date of Patent: *May 26, 2020

(54) PIXEL CIRCUIT AND DRIVE METHOD THEREFOR, DISPLAY PANEL AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Yingsong Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/322,006

(22) PCT Filed: Jan. 24, 2018

(86) PCT No.: PCT/CN2018/073912
§ 371 (c)(1),
(2) Date: Jan. 30, 2019

(87) PCT Pub. No.: WO2018/223712
PCT Pub. Date: Dec. 13, 2018

(65) Prior Publication Data
US 2019/0189724 A1    Jun. 20, 2019

(30) Foreign Application Priority Data

Jun. 5, 2017  (CN) .......................... 2017 1 0414846

(51) Int. Cl.
*H01L 27/32* (2006.01)
*G09G 3/3266* (2016.01)
(Continued)

(52) U.S. Cl.
CPC ....... *H01L 27/3262* (2013.01); *G09G 3/3266* (2013.01); *G09G 3/3275* (2013.01);
(Continued)

(58) Field of Classification Search
CPC .. G09G 3/3266; G09G 3/3275; G09G 3/3233; G09G 2320/0238;
(Continued)

(56) References Cited

U.S. PATENT DOCUMENTS

| 9,495,910 B2 | 11/2016 | Rohatgi |
| 2006/0077194 A1* | 4/2006 | Jeong .................. G09G 3/3233 345/204 |

(Continued)

FOREIGN PATENT DOCUMENTS

| CN | 1758308 A | 4/2006 |
| CN | 101859539 A | 10/2010 |

(Continued)

OTHER PUBLICATIONS

International Search Report and Written Opinion issued in International Patent Application No. PCT/CN2018/073912, dated Apr. 19, 2018; with English translation.

(Continued)

*Primary Examiner* — Ryan A Lubit
(74) *Attorney, Agent, or Firm* — McDermott Will & Emery LLP

(57) ABSTRACT

A pixel circuit includes: a data input sub-circuit for transmitting a reference voltage to a first node; a second control sub-circuit disconnecting a first power terminal from a second node; a driving sub-circuit transmitting a signal of (Continued)

the second node to a third node; a first control sub-circuit transmitting the voltage of the third node to a second power terminal; a first storage sub-circuit storing the voltage between the first power terminal and the second node; and a second storage sub-circuit storing the voltage between the first node and the second node, wherein the data input sub-circuit is configured to transmit a data voltage of a data signal terminal to the first node, the second control sub-circuit is configured to transmit a supply voltage of the first power terminal to the second node, and the driving sub-circuit is configured to output a drive signal to the third node.

18 Claims, 5 Drawing Sheets

(51) Int. Cl.
　　　*G09G 3/3275* (2016.01)
　　　*G09G 3/3233* (2016.01)
(52) U.S. Cl.
　　　CPC ....... *H01L 27/3265* (2013.01); *G09G 3/3233* (2013.01); *G09G 2310/0272* (2013.01); *G09G 2320/0233* (2013.01); *G09G 2320/0238* (2013.01)
(58) Field of Classification Search
　　　CPC .... G09G 2320/0233; G09G 2310/0272; H01L 27/3262; H01L 27/3265
　　　See application file for complete search history.

(56) References Cited

U.S. PATENT DOCUMENTS

| | | |
|---|---|---|
| 2007/0164962 A1 | 7/2007 | Uchino et al. |
| 2008/0225026 A1* | 9/2008 | Uchino ................ G09G 3/3233 345/204 |
| 2012/0249517 A1 | 10/2012 | Toyomura et al. |
| 2014/0098078 A1* | 4/2014 | Jeon ..................... G09G 3/3208 345/205 |
| 2015/0170572 A1 | 6/2015 | Qing et al. |
| 2015/0379956 A1 | 12/2015 | Nonaka et al. |
| 2016/0005356 A1* | 1/2016 | Zhang .................. G09G 3/3233 345/690 |
| 2016/0104427 A1* | 4/2016 | Matsueda ............ G09G 3/3233 345/212 |
| 2016/0293643 A1 | 10/2016 | Kim et al. |
| 2017/0193904 A1 | 7/2017 | Xu et al. |
| 2017/0270862 A1* | 9/2017 | Zhang .................. G09G 3/3233 |
| 2018/0226020 A1 | 8/2018 | Wang et al. |
| 2018/0331171 A1* | 11/2018 | Kim ..................... H01L 27/3223 |
| 2018/0374417 A1 | 12/2018 | Yang et al. |
| 2019/0156762 A1* | 5/2019 | Kimura ................ G09G 3/3266 |
| 2019/0189724 A1 | 6/2019 | Xu |

FOREIGN PATENT DOCUMENTS

| | | |
|---|---|---|
| CN | 103474022 A | 12/2013 |
| CN | 103531151 A | 1/2014 |
| CN | 203760050 U | 8/2014 |
| CN | 104167167 A | 11/2014 |
| CN | 104537983 A | 4/2015 |
| CN | 104867456 A | 8/2015 |
| CN | 105321460 A | 2/2016 |
| CN | 105513539 A | 4/2016 |
| CN | 105654904 A | 6/2016 |
| CN | 106205491 A | 12/2016 |
| CN | 106297660 A | 1/2017 |
| CN | 106486063 A | 3/2017 |
| CN | 106531076 A | 3/2017 |
| CN | 106981269 A | 7/2017 |

OTHER PUBLICATIONS

First Office Action issued in Chinese Patent Application No. 201710414846.3, dated Aug. 13, 2018; with English translation.

* cited by examiner

PIXEL CIRCUIT AND DRIVE METHOD THEREFOR, DISPLAY PANEL AND DISPLAY APPARATUS

CROSS-REFERENCE TO RELATED APPLICATIONS

This application is a national phase entry under 35 USC 371 of International Patent Application No.PCT/CN2018/073912 filed on Jan. 24, 2018, which claims priority to Chinese Patent Application No. 201710414846.3, filed with Chinese Patent Office on Jun. 5, 2017, titled "A PIXEL CIRCUIT AND DRIVE METHOD THEREFOR, DISPLAY PANEL AND DISPLAY APPARATUS", which are incorporated herein by reference in its entirety.

TECHNICAL FIELD

The present disclosure relates to the field of display screens, and in particular, to a pixel circuit and a drive method therefor, a display panel, and a display apparatus.

BACKGROUND

In recent years, due to the excellent display effect of AMOLED (Active-matrix organic light emitting diode) displays, AMOLED displays have been highly favored at home and abroad, with related industries having developed rapidly and various pixel circuits having been successively developed. However, the ELA (Excimer Laser Annealing) progress and the Doping process for fabricating TFTs (Thin Film Transistors) in AMOLED display screen, which are used in actual production, cannot guarantee the good uniformity of TFTs, thereby there existing a Vth (threshold voltage) deviation phenomenon, which results in a deviation in the driving current obtained based on Vth. For instance, in terms of the most basic 2T1C circuits (pixel circuits each including two transistors and one capacitor) in AMOLED display screen, when same data signals are written, luminance of pixels are non-uniform, which is resulted from different Vths in the current formula. Besides, due to the wire voltage drop in the actual AMOLED display, the gate voltages of the driving transistors (DTFTs) are changed, i.e., the gate voltages of the transistors with different distances from the power source are different, thereby resulting in non-uniform luminance of the AMOLED display.

SUMMARY

A first aspect of embodiments of the present disclosure provides a pixel circuit, and the pixel circuit includes a driving sub-circuit, a data input sub-circuit, a first control sub-circuit, a second control sub-circuit, a first storage sub-circuit, and a second storage sub-circuit.

The driving sub-circuit is connected to a first node, a second node and a third node, and the driving sub-circuit is configured to transmit a signal of the second node to the third node under control of a signal of of the first node, wherein, the first node is a point of intersection of an output of the data input sub-circuit with an input of the driving sub-circuit, the second node is a point of intersection of an output of the second control sub-circuit and an output of the first storage sub-circuit, and the third node is a point of intersection of an output of the driving sub-circuit and an output of the first control sub-circuit; the driver sub-circuit is further configured to be cut off under control of a voltage difference between the first node and the second node; the driving sub-circuit is further configured to be in an amplified state under control of the voltage difference between the first node and the second node, and to output a driving signal to the third node under control of a voltage of the second node.

The data input sub-circuit is connected to a first scanning terminal, a data signal terminal and a first node, and the data input sub-circuit is configured to transmit a reference voltage of the data signal terminal to the first node under control of the first scanning terminal; the data input sub-circuit is further configured to transmit a data voltage of the data signal terminal to the first node under control of the first scanning terminal; the data input sub-circuit is further configured to be cut off under control of the first scanning terminal.

The second control sub-circuit is connected to a first power terminal, a second scanning terminal and a second node, and the second control sub-circuit is configured to be cut off under control of the second scanning terminal to disconnect the first power terminal from the second node; the second control sub-circuit is further configured to transmit a supply voltage of the first power terminal to the second node under control of the second scanning terminal.

The first control sub-circuit is connected to the third node, the first scanning terminal and a second power terminal, and the first control sub-circuit is configured to transmit a voltage of the third node to the second power terminal under control of the first scanning terminal.

The first storage sub-circuit is connected to the power level terminal and the second node. The first storage sub-circuit is configured to store a voltage between the first power terminal and the second node. The second storage sub-circuit is connected to the second node and the first node, and the second storage sub-circuit is configured to store a voltage between the first node and the second node. A maximum value of the voltage stored in the first storage sub-circuit is greater than a maximum value of the voltage stored in the second storage sub-circuit.

Optionally, the pixel circuit further includes a light-emitting element connected to the third node and the second power terminal, for emitting light under control of the driving signal.

Optionally, the driving signal output by the driving sub-circuit is irrelevant to a threshold voltage of the driving sub-circuit and the supply voltage of the first power terminal.

Optionally, the driving sub-circuit includes a first transistor. A gate of the first transistor is connected to the first node, a first end of the first transistor is connected to the second node, and a second end of the first transistor is connected to the third node.

Optionally, the data input sub-circuit includes a second transistor. A gate of the second transistor is connected to the first scanning terminal, a first end of the second transistor is connected to the data signal terminal, and a second end of the second transistor is connected to the first node.

Optionally, the first control sub-circuit includes a third transistor. A gate of the third transistor is connected to the first scanning terminal, a first end of the third transistor is connected to the third node, and a second end of the third transistor is connected to the second power terminal.

Optionally, the second control sub-circuit includes a fourth transistor. A gate of the fourth transistor is connected to the second scanning terminal, a first end of the fourth transistor is connected to the first power terminal, and a second end of the fourth transistor is connected to the second node.

Optionally, the first storage sub-circuit includes a first capacitor. A first end of the first capacitor is connected to the first power terminal, and a second end of the first capacitor is connected to the second node.

Optionally, the second storage sub-circuit includes a second capacitor. A first end of the second capacitor is connected to the second node, and a second end of the second capacitor is connected to the first node.

Optionally, the first storage sub-circuit comprises a first capacitor and the second storage sub-circuit comprises a second capacitor, a capacitance value of the first capacitor is larger than a capacitance value of the second capacitor.

Optionally, the light-emitting element includes a light emitting diode. An anode of the light emitting diode is connected to the third node, and a cathode of the light emitting diode is connected to the second power terminal.

Optionally, the first power terminal is a high level terminal and the second power terminal is a low lever terminal.

Optionally, the data voltage is smaller than the reference voltage.

A second aspect of embodiments of the present disclosure provides a driving method of the pixel circuit provided by the first aspect. The method includes a reset phase, a data writing phase, and a driving phase. The reset phase, the data writing phase, and the driving phase are consecutive periods of sequential cycling.

In the reset phase, the data input sub-circuit transmits a reference voltage of the data signal terminal to the first node under control of the first scanning terminal; the second control sub-circuit is in an cut-off state under control of the second scanning terminal; the driving sub-circuit transmits a voltage of the second node to the third node under control of the signal of the first node, and the first control sub-circuit transmits a voltage of the three node to the second power terminal under control of the first scanning terminal; the first storage sub-circuit stores a voltage between the first power terminal and the second node; and the second storage sub-circuit stores a voltage between the first node and the second node.

In the data writing phase, the data input sub-circuit transmits a data voltage of the data signal terminal to the first node under control of the first scanning terminal; the driving sub-circuit is cut off under control of a voltage difference between the first node and the second node; and the second storage sub-circuit stores the voltage between the first node and the second node.

In the driving phase, the data input sub-circuit is cut off under control of the first scanning terminal; the second control sub-circuit transmits the supply voltage of the first power terminal to the second node under control of the second scanning terminal; the driving sub-circuit is in an amplified state under control of the voltage difference between the first node and the second node, and outputs a driving signal to the third node under control of a voltage of the second node.

Optionally, in the driving phase, current passing through the third node when the driving sub-circuit outputs the driving signal to the third node under control of the voltage of the second node is irrelevant to a threshold voltage of the driving sub-circuit and the supply voltage of the first power terminal.

Optionally, in the driving phase, current passing through the third node when the driving sub-circuit outputs the driving signal to the third node under control of the voltage of the second node is calculated through a formula $Idrive=K[(Vdata-Vref)C1/(C1+C2)]^2$, where Idrive is a driving current, Vdata is the data voltage of the data signal terminal, Vref is the reference voltage of the data signal terminal, C1 is a capacitance value of the first storage sub-circuit, C2 is a capacitance value of the second storage sub-circuit.

A third aspect of embodiments of the present disclosure provides a display panel including the pixel circuit provided by the first aspect.

A fourth aspect of embodiments of the present disclosure provides a display device including the display device provided by the third aspect.

BRIEF DESCRIPTION OF THE DRAWINGS

To describe technical solutions in embodiments of the present disclosure more clearly, the accompanying drawings for describing embodiments will be briefly introduced below. Apparently, the accompanying drawings in the following description show merely some of the embodiments of the present disclosure, and for a person skilled in the art, other drawings may be obtained based on these drawings without creative efforts.

DETAILED DESCRIPTION

The technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments obtained by a person skilled in the art based on the embodiments of the present disclosure without creative efforts shall be included in the protection scope of the present disclosure.

It will be noted that in the embodiments of the present disclosure, the word "exemplarily" or "for example" is used to mean examples, example illustrations, or an explanation. Any embodiment or design described as "exemplarily" or "for example" in the embodiments of the present disclosure will not be construed as more preferred or advantageous over other embodiments or designs. Rather, the use of the words "exemplarily" or "for example" is intended to present relevant concepts in a detailed manner.

It will further be noted that in the embodiments of the present disclosure, words "of", "corresponding or relevant" and "corresponding" may sometimes be used interchangeably, and it will be noted that when the differences among these words are not emphasized, the meanings to be expressed by them are consistent.

Transistors used in all embodiments of the present disclosure may be thin film transistors or field effect transistors or other elements having the same features, and the transistors used in the embodiments of the present disclosure are mainly switching transistors according to the functions of the transistors in the circuit. Since a source and a drain of a switching transistor used herein are symmetrical, the source and the drain are interchangeable. In the embodiments of the present disclosure, in order to distinguish these two electrodes of the transistor except a gate, the source is referred to as a first end, and the drain is referred to as a second end. Moreover, it is defined according to the form of the transistor in the figures that a middle end of the transistor is the gate, a signal input end is the source, and a signal output end is the drain.

In the prior art, Vths provided by TFTs are inconsistent due to the manufacturing process of TFTs, which further leads to a deviation in the driving currents obtained based on the Vths. For example, when the Vths provided by TFTs for the pixel circuits of the display panel are inconsistent, the display panel may not emit light uniformly. Meanwhile, due to the wire voltage drop, the supply voltages received by the pixel circuits at different positions are also inconsistent, so that the luminance of pixel circuits in the display panel with different distances from the driving IC are different.

Figure 1:
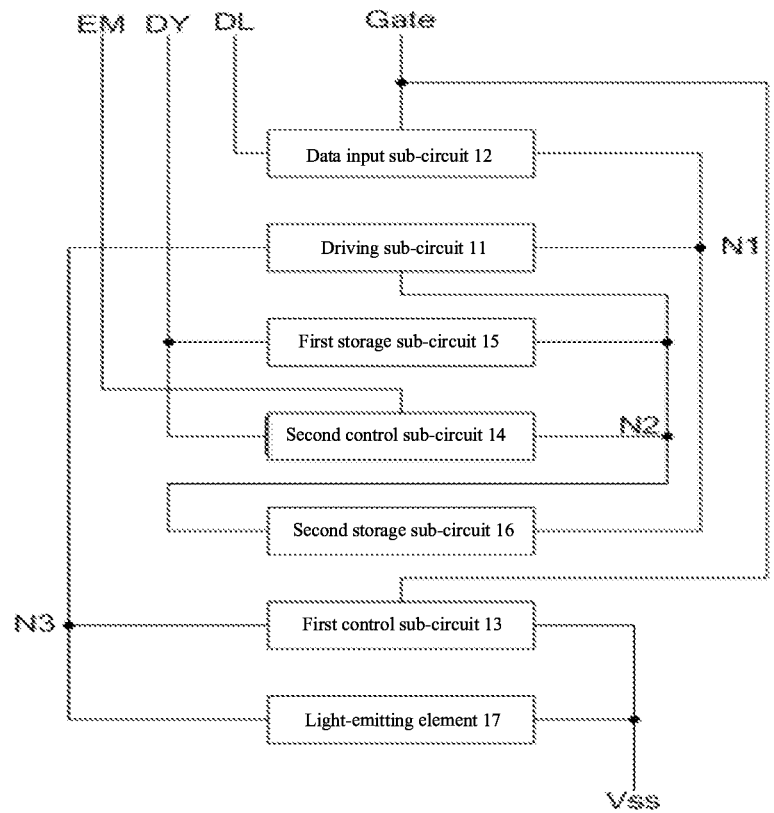
FIG. 1 is a schematic structural diagram of a pixel circuit provided by embodiments of the present disclosure.

In order to solve the above problem, referring to FIG. 1, embodiments of the present disclosure provides a pixel circuit, and the pixel circuit includes a driving sub-circuit 11, a data input sub-circuit 12, a first control sub-circuit 13, a second control sub-circuit 14, a first storage sub-circuit 15, and a second storage sub-circuit 16.

The data input sub-circuit 12 is connected to a first scanning terminal Gate, a data signal terminal DL and a first node N1, and the data input sub-circuit 12 is configured to transmit a reference voltage of the data signal terminal DL to the first node N1 under the control of the first scanning terminal Gate. The first node is a point of intersection of an output of the data input sub-circuit with an input of the driving sub-circuit.

The second control sub-circuit 14 is connected to a first power terminal DY, a second scanning terminal EM and a second node N2, and the second control sub-circuit 14 is configured to be cut off under the control of the second scanning terminal EM to disconnect the first power terminal DY from the second node N2. The second node is a point of intersection of an output of the second control sub-circuit and an output of the first storage sub-circuit. Throughout the specification, a term "cut off" refers to that a current path between two elements is turned off. For example, when a transistor is operated in its cut-off region, a current path between the transistor and an element is turned off.

The driving sub-circuit 11 is connected to the first node N1, the second node N2, and a third node N3, and the driving sub-circuit 11 is configured to transmit a signal of the second node N2 to the third node N3 under control of a signal of the first node N1. The third node is a point of intersection of an output of the driving sub-circuit and an output of the first control sub-circuit.

The first control sub-circuit 13 is connected to the third node N3, the first scanning terminal Gate and a second power terminal Vss, and the first control sub-circuit 13 is configured to transmit a voltage of the third node N3 to the second power terminal Vss under the control of the first scanning terminal Gate.

The first storage sub-circuit 15 is connected to the first power terminal DY and the second node N2, and the first storage sub-circuit 15 is configured to store a voltage between the first power terminal DY and the second node N2. Besides, the second storage sub-circuit 16 is connected to the second node N2 and the first node N1, and the second storage sub-circuit 16 is configured to store a voltage between the first node N1 and the second node N2. In addition, a maximum value of the voltage stored in the first storage sub-circuit 15 is greater than a maximum value of the voltage stored in the second storage sub-circuit 16.

The data input sub-circuit 12 is further configured to transmit a data voltage of the data signal terminal DL to the first node N1 under the control of the first scanning terminal Gate. The driving sub-circuit 11 is further configured to be cut off under the control of a voltage difference between the first node N1 and the second node N2.

The data input sub-circuit 12 is further configured to be cut off under the control of the first scanning terminal Gate. The second control sub-circuit 14 is further configured to transmit a supply voltage of the first power terminal DY to the second node N2 under the control of the second scanning terminal EM. In addition, the driving sub-circuit 11 is further configured to be in an amplified state under the control of the voltage difference between the first node N1 and the second node N2, and to output a driving signal to the third node N3 under control of a voltage of the second node N2. Throughout the specification, a term "amplified state" refers to a state of a structure or circuit when the current of the structure or the circuit is controlled by the voltage applied to the structure or the circuit. Exemplarily, a state of a transistor operated in its saturation region may be referred to the amplified state.

The pixel circuit provided by the embodiments of the present disclosure includes the driving sub-circuit 11, the data input sub-circuit 12, the first control sub-circuit 13, the second control sub-circuit 14, the first storage sub-circuit 15, and the second storage sub-circuit 16. The data input sub-circuit 12 is connected to the first scanning terminal Gate, the data signal terminal DL and the first node N1, and the data input sub-circuit 12 is configured to transmit the reference voltage of the data signal terminal DL to the first node N1 under the control of the first scanning terminal Gate. The second control sub-circuit 14 is connected to the first power terminal DY, the second scanning terminal EM and the second node N2, and the second control sub-circuit 14 is configured to be cut off under the control of the second scanning terminal EM to disconnect the first power terminal DY from the second Node N2. The driving sub-circuit 11 is connected to the first node N1, the second node N2 and the third node N3, and the driving sub-circuit 11 transmits the signal of the second node N2 to the third node N3 under the control of the signal of the first node N1. The first control sub-circuit 13 is connected to the third node N3, the first scanning terminal Gate and the second power terminal Vss, and the first control sub-circuit 13 is configured to transmit the voltage of the third node N3 to the second power terminal Vss under the control of the first scanning terminal Gate. The first storage sub-circuit 15 is connected to the first power terminal DY and the second node N2, and the first storage sub-circuit 15 is configured to store the voltage between the first power terminal DY and the second node N2. The second storage sub-circuit 16 is connected to the second node N2 and the first node N1, and the second storage sub-circuit 16 is configured to store the voltage between the first node N1 and the second node N2. Besides, the maximum value of the voltage stored in the first storage sub-circuit 15 is greater than that stored in the second storage sub-circuit 16. The data input sub-circuit 12 is further configured to transmit the data voltage of the data signal terminal DL to the first node N1 under the control of the first scanning terminal Gate. The driving sub-circuit 11 is further configured to be cut off under the control of the voltage difference between the first node N1 and the second node N2. The data input sub-circuit 12 is further configured to be cut off under the control of the first scanning terminal Gate. The second control sub-circuit 14 is further configured to transmit the supply voltage of the first power terminal DY to the second node N2 under the control of the second scanning terminal EM. The driving sub-circuit 11 is further configured to be in the amplified state under the control of the voltage difference between the first node N1 and the second node N2, and to output the driving signal to the third node N3 under the control of the voltage of the second node N2. Consequently, when the pixel circuit is driven, first, under control of a voltage of the first scanning terminal Gate, the data signal terminal DL and the second scanning terminal EM, a potential of the first node N1 is changed to a reference voltage and a voltage of the second node N2 is directly transmitted to the second power terminal Vss through the third node N3, thereby resetting the potential of the second node N2. Then, the voltage of the first node N1 is changed to a data voltage under control of a voltage of the data signal terminal DL, with the voltage of the second node N2 also being changed correspondingly due to the action of the second storage sub-circuit 16 and the first storage sub-circuit 15. Finally, the voltage of the second node N2 is changed to the supply voltage under the control of the voltage of the first scanning terminal Gate and the second scanning terminal EM. Since the voltage of the first node N1 is changed correspondingly under the action of the second storage sub-circuit 16, the driving sub-circuit 11 outputs a driving signal to the third node N3. During the entire driving process of the pixel circuit, the Vth and the supply voltage are prevented from appearing in the ultimate turn-on voltage formula of the driving sub-circuit 11 under the combined action of the first scanning terminal Gate, the second scanning terminal EM, the data signal terminal DL, and the elements. Thereby, the driving current obtained based on the turn-on voltage is not affected by the Vth and the supply voltage, avoiding the deviation of the obtained driving current.

For example, as shown in FIG. 1, the above pixel circuit may further include a light-emitting element 17 connected to the third node N3 and the second power terminal Vss, and the light-emitting element 17 is configured to emit light under the control of a driving signal. In the embodiments provided by the present invention, since Vth and the supply voltage do not appear in the ultimate turn-on voltage formula of the driving sub-circuit 11, the Vth and the supply voltage do not appear in the current formula of the light-emitting element 17 either. Further, the luminance of light-emitting element 17 is independent of the Vth and the supply voltage, and the luminance of the display panel including the pixel circuits remains consistent. Therefore, the luminance of the pixel circuit provided by the embodiments of the present disclosure may remain unchanged, which solves the problem that the luminance of the display panel including a plurality of pixel circuits is non-uniform due to inconsistency of the Vth and the supply voltage.

Figure 2:
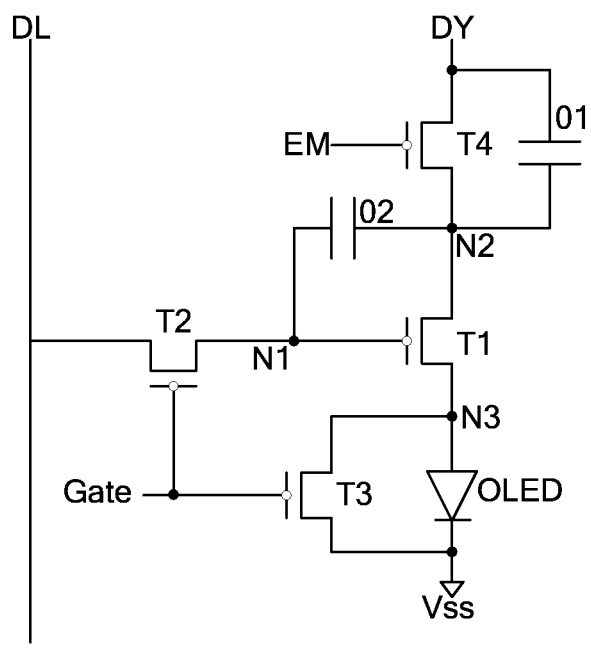
FIG. 2 is a schematic structural diagram of a pixel circuit provided by embodiments of the present disclosure.

In order to illustrate the pixel circuit provided by the embodiments of the present disclosure in more detail, referring to FIG. 2, the specific structure of the pixel circuit provided by embodiments of the present disclosure is illustrated.

The driving sub-circuit 11 includes a first transistor T1. A gate of the first transistor T1 is connected to the first node N1, a first end of the first transistor T1 is connected to the second node N2, and a second end of the first transistor T1 is connected to the third node N3.

The data input sub-circuit 12 includes a second transistor T2. A gate of the second transistor T2 is connected to the first scanning terminal Gate, a first end of the second transistor T2 is connected to the data signal terminal DL, and a second end of the second transistor T2 is connected to the first node N1.

The first control sub-circuit 13 includes a third transistor T3. A gate of the third transistor T3 is connected to the first scanning terminal Gate, a first end of the third transistor T3 is connected to the third node N3, and a second end of the third transistor T3 is connected to the second power terminal Vss.

The second control sub-circuit 14 includes a fourth transistor T4. A gate of the fourth transistor T4 is connected to the second scanning terminal EM, a first end of the fourth transistor T4 is connected to the first power terminal DY, and a second end of the fourth transistor T4 is connected to the second node N2.

The first storage sub-circuit 15 includes a first capacitor 01. A first end of the first capacitor 01 is connected to the first power terminal, and a second end of the first capacitor 01 is connected to the second node N2. The second storage sub-circuit 16 includes a second capacitor 02. A first end of the second capacitor 02 is connected to the second node N2, and a second end of the second capacitor 02 is connected to the first node N1. In an embodiment of the present disclosure, a capacitance value C1 of the first capacitor 01 is much greater than a capacitance value C2 of the second capacitor 02.

The light-emitting element 17 includes a light emitting diode (e.g., OLED). A anode of the light emitting diode is connected to the third node N3, and a cathode of the light emitting diode is connected to the second power terminal Vss.

The switching transistor and the driving transistor used in embodiments of the present disclosure are both P-type transistors. However, N-type transistors can also be used in this pixel circuit. The N-type switching transistor is turned on when the gate is at a high level, and is cut off when the gate is at a low level. The P-type driving transistor is in an amplified state or a saturated state when a gate voltage thereof is a low level (the gate voltage being smaller than a source voltage) and an absolute value of a voltage difference between the gate and the source thereof is greater than a threshold voltage. In addition, The N-type driving transistor is in an amplified state or a saturated state when a gate voltage thereof is a high level (the gate voltage being greater than a source voltage) and an absolute value of a voltage difference between the gate and the source thereof is greater than a threshold voltage. In practice, the pixel circuit provided by embodiments of the present disclosure may also use N-type transistors, and the driving sub-circuit needs to be simply modified correspondingly from the structure. In the operation, it is merely necessary to simply change the switching signal (the high level being changed to a low level, and the low level being changed to a high level). Moreover, these changes are obvious to a person skilled in the art, and are also included in the protection scope of embodiments of the present disclosure.

In order to embody the driving process of the pixel circuit provided by embodiments of the present disclosure, embodiments of the present disclosure provide a driving method of the pixel circuit, and the method includes a reset phase, a data writing phase, and a light-emitting phase. The reset phase, the data writing phase, and the light-emitting phase are three consecutive periods of sequential cycling.

The driving method of the pixel circuit provided by the embodiments of the present disclosure is specifically illustrated with reference to FIGS. 1 and 3.

Figure 3:
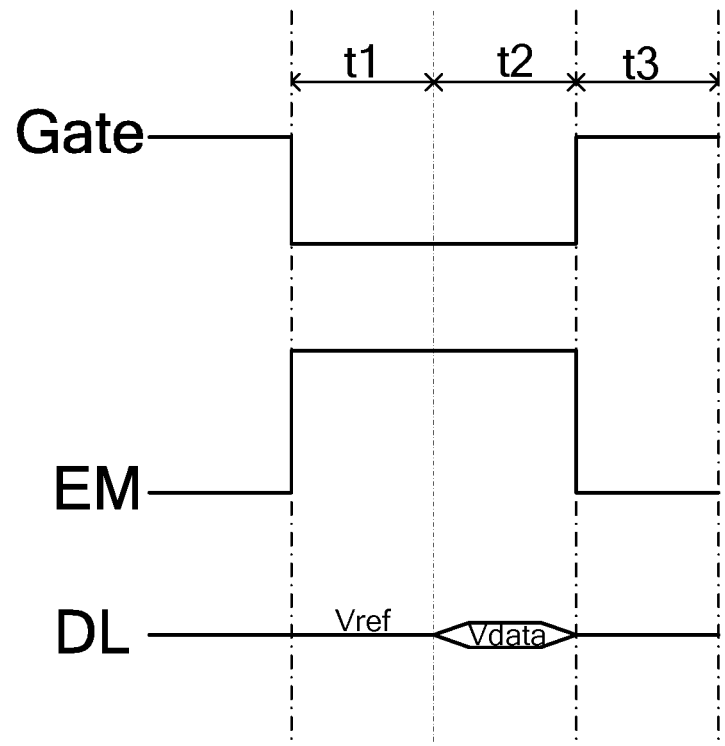
FIG. 3 is a signal timing diagram of a pixel circuit provided by embodiments of the present disclosure.

In the reset phase (t1), it can be seen from the timing diagram of FIG. 3 that in this phase, the first scanning terminal Gate is set to be at a low level, the second scanning terminal EM is set to be at a high level, and the voltage of the data signal terminal DL is a reference voltage Vref.

The data input sub-circuit 12 transmits the reference voltage Vref of the data signal terminal DL to the first node N1 under the control of the first scanning terminal Gate. The second control sub-circuit 14 is in a cut-off state under the control of the second scanning terminal EM. The driving sub-circuit 11 transmits a voltage of the second node N2 to the third node N3 under the control of the signal of the first node N1. The first control sub-circuit 13 transmits the voltage of the third node N3 to the second power terminal Vss under the control of the first scanning terminal Gate. The first storage sub-circuit 15 stores a voltage between the first power terminal DY and the second node N2. The second storage sub-circuit 16 stores a voltage between the first node N1 and the second node N2.

The main function of the reset phase is to reset the voltages of the first node N1 and the second node N2 from their voltages in the light-emitting phase of the previous driving process to implement this illumination.

In the data writing phase (t2), it can be seen from the timing diagram of FIG. 3 that in this phase, the first scanning terminal Gate is set to be at a low level, the second scanning terminal EM is set to be at a high level, and the voltage of the data signal terminal DL is a data voltage Vdata. In embodiments of the present disclosure, the reference voltage Vref is a low level, and the data voltage Vdata is smaller than the reference voltage Vref.

The data input sub-circuit 12 transmits the data voltage Vdata of the data signal terminal DL to the first node N1 under the control of the first scanning terminal Gate. The driving sub-circuit 11 is cut off under the control of a voltage difference between the first node N1 and the second node N2. The second storage sub-circuit 16 stores a voltage between the first node N1 and the second node N2.

The data writing phase is mainly for causing a required voltage change to be generated at the second node N2 under the actions of the voltage change of the first node N1, and the first storage sub-circuit 15 as well as the second storage sub-circuit 16.

In the driving phase (t3), it can be seen from the timing diagram of FIG. 3 that in this phase, the first scanning terminal Gate is set to be at a high level, the second scanning terminal EM is set to be at a low level, and the data signal terminal DL is not controlled.

The data input sub-circuit 12 is cut off under the control of the first scanning terminal Gate. The second control sub-circuit 14 transmits the supply voltage Vdd of the first power terminal DY to the second node N2 under the control of the second scanning terminal EM. The driving sub-circuit 11 is in an amplified state under the control of the voltage difference between the first node N1 and the second node N2, and outputs a driving signal to the third node N3 under the control of the voltage of the second node N2.

In the driving phase, the voltage of the first node N1 is also changed due to the changing of the voltage of the second node N2 and the action of the second storage sub-circuit 16. Due to the voltage difference between the first node N1 and the second node N2, the driving sub-circuit 11 outputs a driving signal to the third node N3. Based on the voltage changes of the first node N1 and the second node N2 resulted from both of the present phase and the previous phase, as well as the calculation formula of the driving current, a driving current formula that does not include Vth and the supply voltage Vdd may be obtained, so that the driving current obtained based on the pixel circuits are constant, i.e., the driving current supplied by the pixel circuit for a structure such as a light-emitting element is constant. The luminance of the display panel including the pixel circuits is no longer non-uniform which is resulted from the differences of Vths and the differences of the supply voltages among pixel circuits.

It will be noted that since the voltage of the second node N2 needs to be reset to be lower in the reset phase, and due to the action of the first storage sub-circuit 15, this phase requires sufficient time. Besides, since the voltage of the second node N2, after changing along with the voltage of the first node N1 changing, needs not to be reduced too much in the data writing phase, and thereby time required in the data writing phase is shorter, that is, t1>t2. No specific limitations are made in light-emitting phase.

Figure 4:
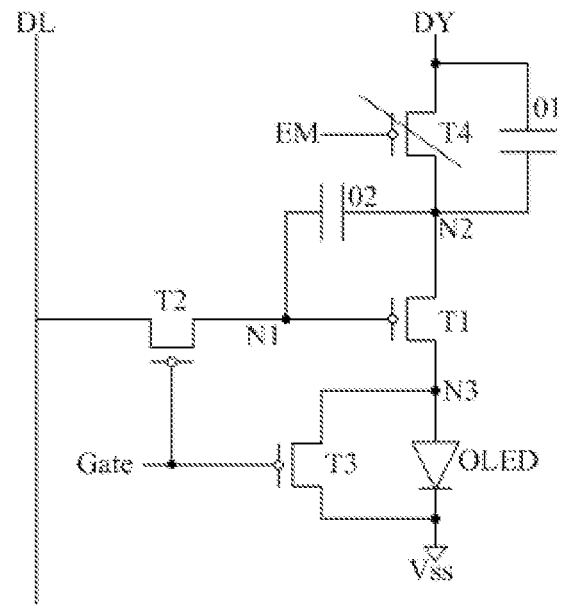
FIG. 4 is a schematic structural diagram of a pixel circuit in a reset phase provided by embodiments of the present disclosure.
Figure 5:
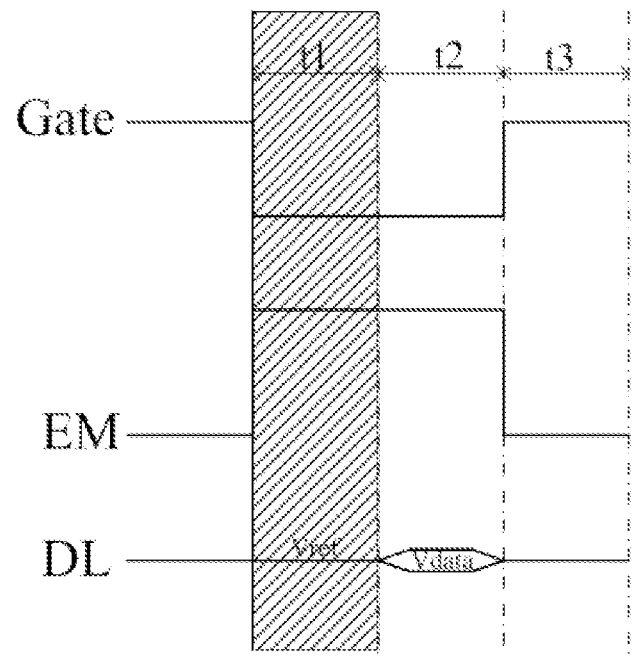
FIG. 5 is a signal timing diagram of a pixel circuit in a reset phase provided by embodiments of the present disclosure.

Exemplarily, referring to the structural diagram of the pixel circuit in the reset phase shown in FIG. 4 (the transistor with an oblique line thereon in FIG. 4 indicating that the transistor is in a cut-off state) and the timing state diagram shown in FIG. 5 (the shaded portion in the figure indicating the time period that the pixel circuit is in), the working principle of the pixel circuit provided by embodiments of the present disclosure in the reset phase is illustrated.

In the reset phase, namely, the t1 phase, the first scanning terminal Gate is set to be at a low level, so that the second transistor T2 and the third transistor T3 are turned on. A reference voltage Vref is controlled to be input via the data signal terminal DL, so that the voltage of the first node N1 becomes Vref. The second scanning terminal EM is set to be at a high level, so that the fourth transistor T4 is cut off. Due to the influence of the final light-emitting phase of the previous driving process, the voltage of the second node N2 is the supply voltage Vdd of the first power terminal DY. Moreover, since the first transistor T1 and the third transistor T3 are both turned on in this phase, the voltage of the second node N2 will gradually decrease until the first transistor T1 is cut off, that is, until the potential of the second node N2 becomes a difference between Vref and Vth (Vref−Vth).

Figure 6:
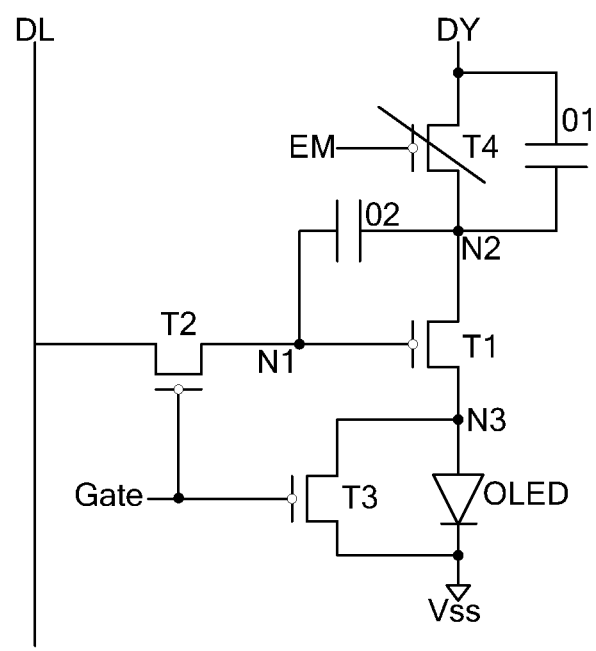
FIG. 6 is a schematic structural diagram of a pixel circuit in a data writing phase provided by an embodiment of the present disclosure.
Figure 7:
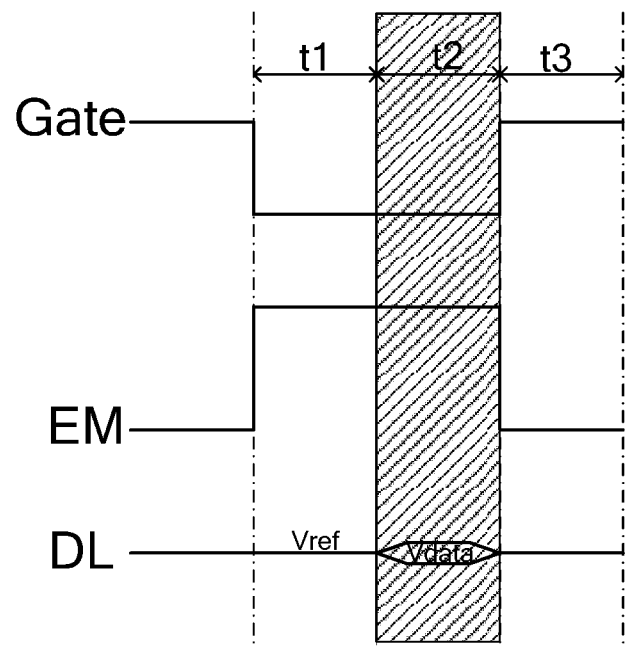
FIG. 7 is a signal timing diagram of a pixel circuit in a data writing phase provided by embodiments of the present disclosure.

Exemplarily, referring to the structural diagram of the pixel circuit in the data writing phase shown in FIG. 6 (the transistor with an oblique line thereon in FIG. 6 indicating that the transistor is at a cut-off state) and the timing state diagram shown in FIG. 7 (the shaded portion in the figure is the time period that the pixel circuit is in), the working principle of the pixel circuit provided by embodiments of the present disclosure in the data writing phase is illustrated.

In the data writing phase, namely, the t2 phase, the first scanning terminal Gate is set to be at a low level, so that the second transistor T2 and the third transistor T3 are turned on. The second scanning terminal EM is set to be at a high level, so that the fourth transistor T4 is cut off. A data voltage Vdata is controlled to be input via the data signal terminal DL so that the voltage of the first node N1 is changed to Vdata. The voltage of the second node is changed to Vref−Vth+(Vdata−Vref)C2/(C1+C2) due to the coupling of the first capacitor 01 and the second capacitor 02. In this phase, it is necessary to ensure that the voltage of the second node N2 does not change greatly due to the turn-on states of the first transistor T1 and the third transistor T3. Therefore, the capacitance value C1 of the first capacitor 01 is required to be sufficiently large, and the time in the data writing phase is required to be smaller.

Figure 8:
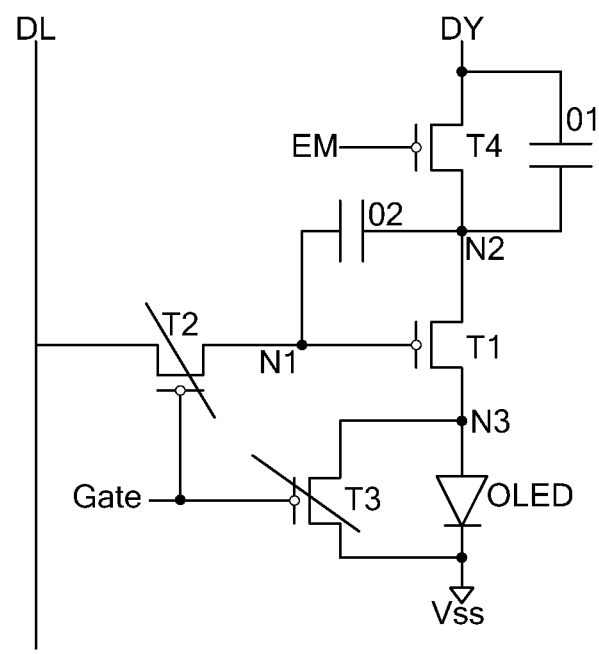
FIG. 8 is a schematic structural diagram of a pixel circuit in a light-emitting phase provided by embodiments of the present disclosure.
Figure 9:
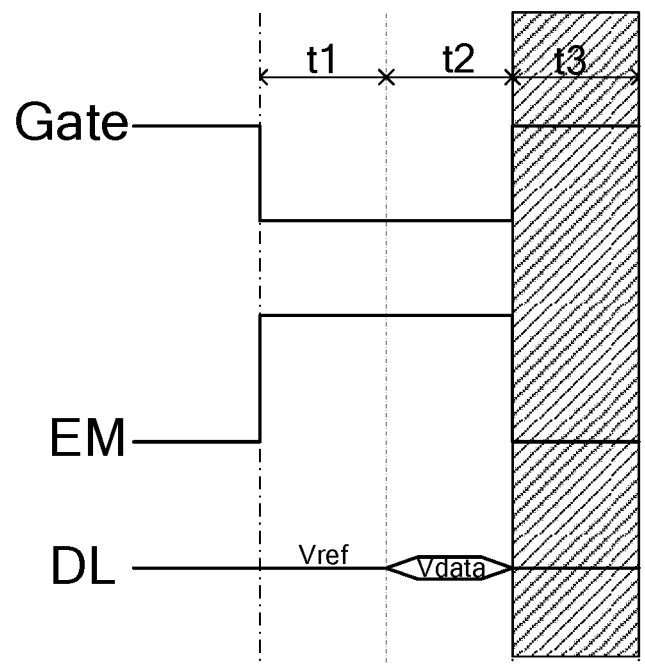
FIG. 9 is a signal timing diagram of a pixel circuit in a light-emitting phase provided by embodiments of the present disclosure.

Exemplarily, referring to the structural diagram of the pixel circuit in the driving phase shown in FIG. 8 (the transistor with an oblique line thereon in FIG. 8 indicating that the transistor is at a cut-off state) and the timing state diagram shown in FIG. 9 (the shaded portion in the figure is the time period that the pixel circuit is in), the working principle of the pixel circuit provided by embodiments of the present disclosure in the light-emitting phase is illustrated.

In the driving phase, namely, the t3 phase, the first scanning terminal Gate is set to be at a high level, so that the second transistor T2 and the third transistor T3 are cut off. The second scanning terminal EM is set to be at a low level, so that the fourth transistor T4 is turned on and the voltage of the second node N2 is suddenly changed to the supply voltage Vdd. The voltage of the first node N1 is changed to Vdata+Vdd−Vref+Vth−(Vdata−Vref)C2/(C1+C2) due to the coupling of the second capacitor 02. At this time, no control is implemented on the data signal terminal DL. The first transistor T1 is in an amplified state under the control of the voltage difference Vgs between the first node N1 and the second node N2, thereby the first transistor outputting a driving signal to the third node N3. In addition, the driving current is Idrive=K[Vgs−Vth]$^2$=K[(Vdata−Vref)C1/(C1+C2)]$^2$≈K(Vdata−Vref)$^2$ (since C1 is large enough, and is much larger than C2), wherein, K=½ $\mu_p C_{ox}$ W/L, where $\mu_p$ is a carrier mobility of a semiconductor channel, $C_{ox}$ is a capacitance value of a gate oxide layer per unit area, and W/L is a ratio of a width of the semiconductor channel to a length of the semiconductor channel. It can be seen from the formula that the driving current is not affected by Vth and the supply voltage after three phases.

In the driving method of the pixel circuit provided by the above embodiments, the driving sub-circuit 11 in the pixel circuit provided by the embodiments of the present disclosure can be the first transistor T1. The gate of the first transistor T1 is connected to the first node N1, the first end of the first transistor T1 is connected to the second node N2, and the second end of the first transistor T1 is connected to the third node N3. The data input sub-circuit 12 can be the second transistor T2. The gate of the second transistor T2 is connected to the first scanning terminal Gate, the first end of the second transistor T2 is connected to the data signal terminal DL, and the second end of the second transistor T2 is connected to the first node N1. The first control sub-circuit 13 can be the third transistor T3. The gate of the third transistor T3 is connected to the first scanning terminal Gate, the first end of the third transistor T3 is connected to the third node N3, and the second end of the third transistor T3 is connected to the second power terminal Vss. The second control sub-circuit 14 can be the fourth transistor T4. The gate of the fourth transistor T4 is connected to the second scanning terminal EM, the first end of the fourth transistor T4 is connected to the first power terminal DY, and the second end of the fourth transistor T4 is connected to the second node N2. The first storage sub-circuit 15 can be the first capacitor 01. The first end of the first capacitor 01 is connected to the first power terminal DY, and the second end of the first capacitor 01 is connected to the second node N2. The second storage sub-circuit 16 can be the second capacitor 02. The first end of the second capacitor 02 is connected to the second node N2, and the second end of the second capacitor 02 is connected to the first node N1. The capacitance value of the first capacitor 01 is much larger than that of the second capacitor 02. When the pixel circuit is driven, first, in the reset phase, the second transistor T2 and the third transistor T3 are turned on under the control of the first scanning terminal Gate, and the fourth transistor T4 is cut off under the control of the second scanning terminal EM. The voltage of the data signal terminal DL is controlled to be a reference voltage, thereby resetting the voltages of the first node N1 and the second node N2 from the voltages in the light-emitting phase of the previous driving process. Then, in the data writing phase, the second transistor T2 and the third transistor T3 are turned on under the control of the first scanning terminal Gate, and the fourth transistor T4 is cut off under the control of the second scanning terminal EM. The data voltage is controlled to be input via the data signal terminal DL, thereby causing a required voltage change to be generated at the second node N2 under the actions of the voltage change of the first node N1 as well as the first storage sub-circuit 15 and the second storage sub-circuit 16. Finally, in the final driving phase, the second transistor T2 and the third transistor T3 are cut off under the control of the first scanning terminal Gate, and the fourth transistor T4 is turned on under the control of the second scanning terminal EM, so that the voltage of the second node N2 is suddenly changed to the supply voltage. Therefore, the voltage of the first node N1 is changed due to the changing of the voltage of the second node N2 and the action of the second storage sub-circuit. The driving sub-circuit 11 outputs a driving signal to the third node N3 due to the voltage difference between the first node N1 and the second node N2. Based on the voltage changes of the first node N1 and the second node N2 resulted from the three phases in the entire driving process, and the calculation formula of the driving current, a driving current formula that does not include Vth and the supply voltage can be obtained, thereby the driving current obtained based on the pixel circuit being constant, i.e., the driving current supplied by the pixel circuit for a structure such as a light-emitting element being constant. The luminance of the display panel including the pixel circuits is no longer non-uniform which is resulted from the differences of Vths and the differences of the supply voltages among pixel circuits.

Embodiments of the present disclosure provide a display panel including the pixel circuit provided by the foregoing embodiments.

Figure 10:
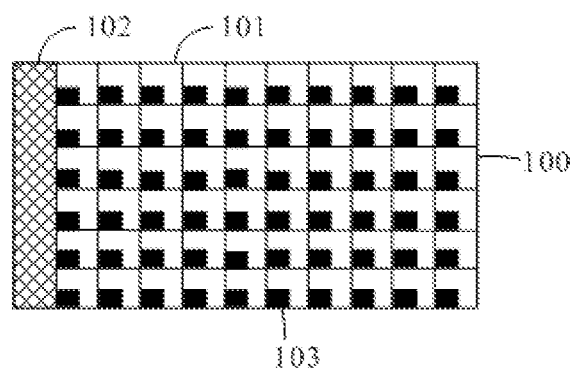
FIG. 10 is a schematic structural diagram of a display panel provided by embodiments of the present disclosure.

Exemplarily, referring to the display panel shown in FIG. 10, the display panel 100 includes a display area 101 and a driving area 102. The display area 101 includes a plurality of pixel circuits 103 provided by the foregoing embodiments.

Figure 11:
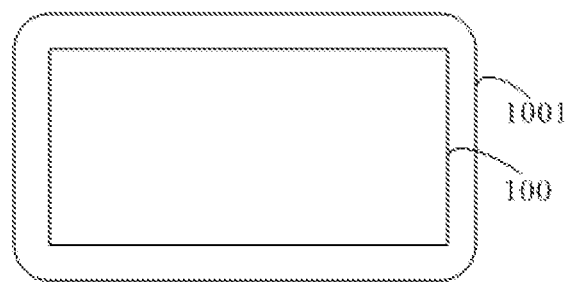
FIG. 11 is a schematic structural diagram of a display device provided by embodiments of the present disclosure.

Embodiments of the present disclosure provide a display device including the above display panel. Exemplarily, referring to the display device shown in FIG. 11, the display device 1001 includes the display panel 100. The display device 100 may also include other suitable structures. The display device 100 here may be any product or component with a display function such as an electronic paper, a mobile phone, a tablet PC, a television, a display, a laptop, a digital photo frame, a navigator, etc.

Embodiments of the present disclosure provide a computer program that can be directly loaded into a storage sub-circuit and contains a software code. Moreover, the process of driving the pixel circuit described above can be implemented after the computer program is loaded and executed by a computer.

The foregoing descriptions are detailed descriptions of the present disclosure, but the protection scope of the present disclosure is not limited thereto. Any variation or replacement easily conceivable by a person skilled in the art in the technical scope disclosed by the present disclosure shall fall in the protection scope of the present disclosure. Therefore, the protection scope of the present disclosure should be subject to the protection scope of the claims.

What is claimed is:

1. A pixel circuit, comprising a driving sub-circuit, a data input sub-circuit, a first control sub-circuit, a second control sub-circuit, a first storage sub-circuit and a second storage sub-circuit, wherein
the driving sub-circuit is connected to a first node, a second node and a third node, and the driving sub-circuit is configured to transmit a signal of the second node to the third node under control of a signal of the first node, wherein, the first node is a point of intersection of an output of the data input sub-circuit with an input of the driving sub-circuit, the second node is a point of intersection of an output of the second control sub-circuit and an output of the first storage sub-circuit, and the third node is a point of intersection of an output of the driving sub-circuit and an output of the first control sub-circuit; the driving sub-circuit is further configured to be cut off under control of a voltage difference between the first node and the second node; the driving sub-circuit is further configured to be in an amplified state under control of the voltage difference between the first node and the second node, and to output a driving signal to the third node under control of a voltage of the second node;
the data input sub-circuit is connected to a first scanning terminal, a data signal terminal and the first node, and the data input sub-circuit is configured to transmit a reference voltage of the data signal terminal to the first node under control of the first scanning terminal; the data input sub-circuit is further configured to transmit a data voltage of the data signal terminal to the first node under control of the first scanning terminal; the data input sub-circuit is further configured to be cut off under control of the first scanning terminal;
the second control sub-circuit is connected to a first power terminal, a second scanning terminal and the second node, and the second control sub-circuit is configured to be cut off under control of the second scanning terminal to disconnect the first power terminal from the second node; the second control sub-circuit is further configured to transmit a supply voltage of the first power terminal to the second node under control of the second scanning terminal;
the first control sub-circuit is connected to the third node, the first scanning terminal and a second power terminal, and the first control sub-circuit is configured to transmit a voltage of the third node to the second power terminal under control of the first scanning terminal;
the first storage sub-circuit is connected to the first power terminal and the second node, and the first storage sub-circuit is configured to store a voltage between the first power terminal and the second node; the second storage sub-circuit is connected to the second node and the first node, and the second storage sub-circuit is configured to store a voltage between the first node and the second node; a maximum value of the voltage stored in the first storage sub-circuit is greater than a maximum value of the voltage stored in the second storage sub-circuit.

2. The pixel circuit according to claim 1, wherein the pixel circuit further comprises a light-emitting element connected to the third node and the second power terminal, and the light-emitting element is configured to emit light under control of the driving signal.

3. The pixel circuit according to claim 2, wherein the light-emitting element comprises a light emitting diode;
an anode of the light-emitting diode is connected to the third node, and a cathode of the light emitting diode is connected to the second power terminal.

4. The pixel circuit according to claim 2, wherein the driving signal output by the driving sub-circuit is irrelevant to a threshold voltage of the driving sub-circuit and the supply voltage of the first power terminal.

5. The pixel circuit according to claim 1, wherein the driving sub-circuit comprises a first transistor;
a gate of the first transistor is connected to the first node, a first end of the first transistor is connected to the second node, and a second end of the first transistor is connected to the third node.

6. The pixel circuit according to claim 1, wherein the data input sub-circuit comprises a second transistor;
a gate of the second transistor is connected to the first scanning terminal, a first end of the second transistor is connected to the data signal terminal, and a second end of the second transistor is connected to the first node.

7. The pixel circuit according to claim 1, wherein the first control sub-circuit comprises a third transistor;
a gate of the third transistor is connected to the first scanning terminal, a first end of the third transistor is connected to the third node, and a second end of the third transistor is connected to the second power terminal.

8. The pixel circuit according to claim 1, wherein the second control sub-circuit comprises a fourth transistor;
a gate of the fourth transistor is connected to the second scanning terminal, a first end of the fourth transistor is connected to the first power terminal, and a second end of the fourth transistor is connected to the second node.

9. The pixel circuit according to claim 1, wherein the first storage sub-circuit comprises a first capacitor;
a first end of the first capacitor is connected to the first power terminal, and a second end of the first capacitor is connected to the second node.

10. The pixel circuit according to claim 1, wherein the second storage sub-circuit comprises a second capacitor;
a first end of the second capacitor is connected to the second node, and a second end of the second capacitor is connected to the first node.

11. A display panel, comprising pixel circuits according to claim 1.

12. A display apparatus, comprising the display panel according to claim 11.

13. The pixel circuit according to claim 1, wherein the first storage sub-circuit comprises a first capacitor and the second storage sub-circuit comprises a second capacitor, a capacitance value of the first capacitor is larger than a capacitance value of the second capacitor.

14. The pixel circuit according to claim 1, wherein the first power terminal is a high level terminal and the second power terminal is a low lever terminal.

15. The pixel circuit according to claim 1, wherein the data voltage is smaller than the reference voltage.

16. A driving method of the pixel circuit according to claim 1, the method comprising a reset phase, a data writing phase and a driving phase, the reset phase, the data writing phase and the driving phase being consecutive periods of sequential cycling, wherein in the reset phase:
the data input sub-circuit transmits a reference voltage of the data signal terminal to the first node under control of the first scanning terminal; the second control sub-circuit is in a cut-off state under control of the second scanning terminal; the driving sub-circuit transmits a voltage of the second node to the third node under control of a signal of the first node, and the first control sub-circuit transmits a voltage of the third node to the second power terminal under control of the first scanning terminal; the first storage sub-circuit stores a voltage between the first power terminal and the second node; and the second storage sub-circuit stores a voltage between the first node and the second node;

in the data writing phase:
the data input sub-circuit transmits a data voltage of the data signal terminal to the first node under control of the first scanning terminal; the driving sub-circuit is cut off under control of a voltage difference between the first node and the second node; and the second storage sub-circuit stores the voltage between the first node and the second node; and in the driving phase:
the data input sub-circuit is cut off under control of the first scanning terminal; the second control sub-circuit transmits the supply voltage of the first power terminal to the second node under control of the second scanning terminal; the driving sub-circuit is in an amplified state under control of the voltage difference between the first node and the second node, and outputs a driving signal to the third node under control of a voltage of the second node.

17. The driving method of the pixel circuit according to claim 16, wherein in the driving phase, current passing through the third node when the driving sub-circuit outputs the driving signal to the third node under control of the voltage of the second node is irrelevant to a threshold voltage of the driving sub-circuit and the supply voltage of the first power terminal.

18. The driving method of the pixel circuit according to claim 17, wherein, in the driving phase, current passing through the third node when the driving sub-circuit outputs the driving signal to the third node under control of the voltage of the second node is calculated through a formula:

$$I\text{drive}=K[(V\text{data}-V\text{ref})C1/(C1+C2)]^2$$

where Idrive is a driving current, Vdata is the data voltage of the data signal terminal, Vref is the reference voltage of the data signal terminal, C1 is a capacitance value of the first storage sub-circuit, C2 is a capacitance value of the second storage sub-circuit.

* * * * *